United States Patent
Dinh et al.

(10) Patent No.: US 9,530,495 B1
(45) Date of Patent: Dec. 27, 2016

(54) RESISTIVE SWITCHING MEMORY HAVING A RESISTOR, DIODE, AND SWITCH MEMORY CELL

(71) Applicant: Adesto Technologies Corporation, Sunnyvale, CA (US)

(72) Inventors: John Dinh, Dublin, CA (US); Venkatesh P. Gopinath, Fremont, CA (US); Nathan Gonzales, San Jose, CA (US); Derric Lewis, Sunnyvale, CA (US); Deepak Kamalanathan, Santa Clara, CA (US); Ming Sang Kwan, San Leandro, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 14/819,014

(22) Filed: Aug. 5, 2015

(51) Int. Cl.
   *G11C 13/00* (2006.01)
   *H01L 27/24* (2006.01)
   *H01L 45/00* (2006.01)

(52) U.S. Cl.
   CPC ......... *G11C 13/0069* (2013.01); *G11C 13/004* (2013.01); *H01L 27/2436* (2013.01); *H01L 45/12* (2013.01); *H01L 45/122* (2013.01); *H01L 45/1253* (2013.01); *G11C 13/0011* (2013.01); *G11C 13/0097* (2013.01); *G11C 2013/0045* (2013.01); *G11C 2013/0078* (2013.01)

(58) Field of Classification Search
   CPC .................................................. G11C 13/0097
   USPC ......................................................... 365/148
   See application file for complete search history.

(56) References Cited

U.S. PATENT DOCUMENTS

| | | | |
|---|---|---|---|
| 5,767,537 A | 6/1998 | Yu et al. | |
| 5,777,924 A | 7/1998 | Lee et al. | |
| 7,551,473 B2 | 6/2009 | Lung et al. | |
| 8,659,931 B1 | 2/2014 | Ertosun | |
| 8,730,752 B1 | 5/2014 | Kamalanathan et al. | |
| 8,803,120 B2 | 8/2014 | Rathor et al. | |
| 8,941,089 B2 | 1/2015 | Gopalan et al. | |
| 8,947,913 B1 | 2/2015 | Derhacobian et al. | |
| 9,001,553 B1 | 4/2015 | Kamalanathan | |
| 9,099,176 B1 * | 8/2015 | Buskirk | G11C 13/0011 |
| 2006/0092700 A1 | 5/2006 | Watanabe | |
| 2011/0147821 A1 | 6/2011 | Dhaoui et al. | |
| 2013/0100756 A1 | 4/2013 | Liao et al. | |
| 2013/0314975 A1 * | 11/2013 | Katayama | G11C 13/0069 365/148 |
| 2014/0160830 A1 | 6/2014 | Chung | |
| 2015/0162079 A1 | 6/2015 | Koushan et al. | |

* cited by examiner

*Primary Examiner* — Son Mai
(74) *Attorney, Agent, or Firm* — Michael C. Stephens, Jr.

(57) ABSTRACT

In one embodiment, a semiconductor memory device includes a plurality of resistive switching memory cells, where each resistive switching memory cell can include: (i) a programmable impedance element having an anode and a cathode; (ii) an access transistor having a drain coupled to a bit line, a source coupled to the programmable impedance element cathode, and a gate coupled to a word line; (iii) a well having a first diffusion region configured as the source, a second diffusion region configured as the drain, and a third diffusion region configured as a well contact; and (iv) a diode having a cathode at the second diffusion region, and an anode at the third diffusion region, where the diode is turned on during an erase operation on the programmable impedance element.

20 Claims, 16 Drawing Sheets

RESISTIVE SWITCHING MEMORY HAVING A RESISTOR, DIODE, AND SWITCH MEMORY CELL

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive switching memory technologies that include resistive RAM (ReRAM) and conductive bridging RAM (CBRAM), may offer relatively lower power and higher speeds as compared to flash memory technologies. For example, CBRAM utilizes a conductive bridging cell technology, which has the potential to scale to smaller sizes than flash memory devices.

SUMMARY

Embodiments of the present invention relate to a resistive switching memory device. Particular embodiments are suitable for resistive switching memories, such as resistive random-access memory (ReRAM) and/or conductive bridging RAM (CBRAM) memory cells.

In one embodiment, a semiconductor memory device includes a plurality of resistive switching memory cells, where each resistive switching memory cell can include: (i) a programmable impedance element having an anode and a cathode; (ii) an access transistor having a drain coupled to a bit line, a source coupled to the programmable impedance element cathode, and a gate coupled to a word line; (iii) a well having a first diffusion region configured as the source, a second diffusion region configured as the drain, and a third diffusion region configured as a well contact; and (iv) a diode having a cathode at the first diffusion region, and an anode at the third diffusion region, where the diode is turned on during an erase operation on the programmable impedance element.

In one embodiment, a method of controlling a resistive switching memory cell, can include: (i) determining if a command to executed on the resistive switching memory cell is a read operation, a program operation, or an erase operation, where the resistive switching memory cell can include: a programmable impedance element having an anode and a cathode; an access transistor having a drain coupled to a bit line, a source coupled to the programmable impedance element cathode, and a gate coupled to a word line; a well having a first diffusion region configured as the source, a second diffusion region configured as the drain, and a third diffusion region configured as a well contact; and a diode having an anode at the first diffusion region, and a cathode at the third diffusion region; (ii) turning on the word line for the program operation and the read operation; (iii) turning off the word line for the erase operation; and (iv) turning on the diode for the erase operation.

In one embodiment, a semiconductor memory device includes a plurality of resistive switching memory cells, where each resistive switching memory cell can include: (i) a programmable impedance element having an anode and a cathode; (ii) an access transistor having a source coupled to a bit line, a drain coupled to the programmable impedance element anode, and a gate coupled to a word line; (iii) a well having a first diffusion region configured as the source, a second diffusion region configured as the drain, and a third diffusion region configured as a well contact; and (iv) a diode having an anode at the second diffusion region, and a cathode at the third diffusion region, where the diode is turned on during an erase operation on the programmable impedance element.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Example CBRAM Cell Structure and Arrangement

Particular embodiments may be directed to resistive switching memories (e.g., conductive bridging random-access memory [CBRAM], resistive RAM [ReRAM], etc.). The invention, in its various aspects, will be explained in greater detail below with regard to exemplary embodiments. Particular embodiments can include structures and methods of operating resistive switching memories that can be programmed/written and erased between one or more resistance and/or capacitive states. Resistive switching memory devices can include a plurality of resistive memory cells with "programmable impedance elements" or any type of resistive switching or resistance-change memory cells or elements.

Figure 1:
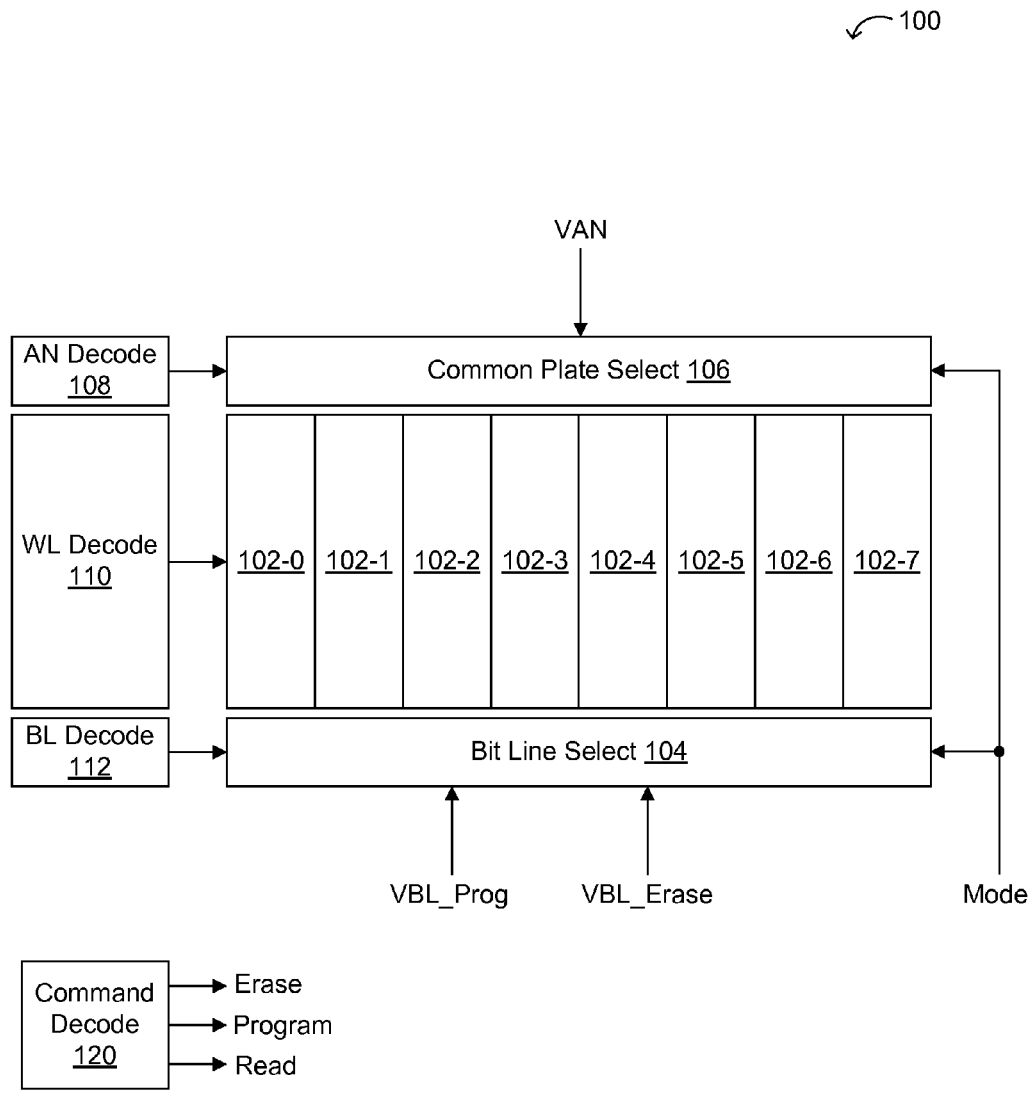
FIG. 1 is an example memory device arrangement.
Figure 2:
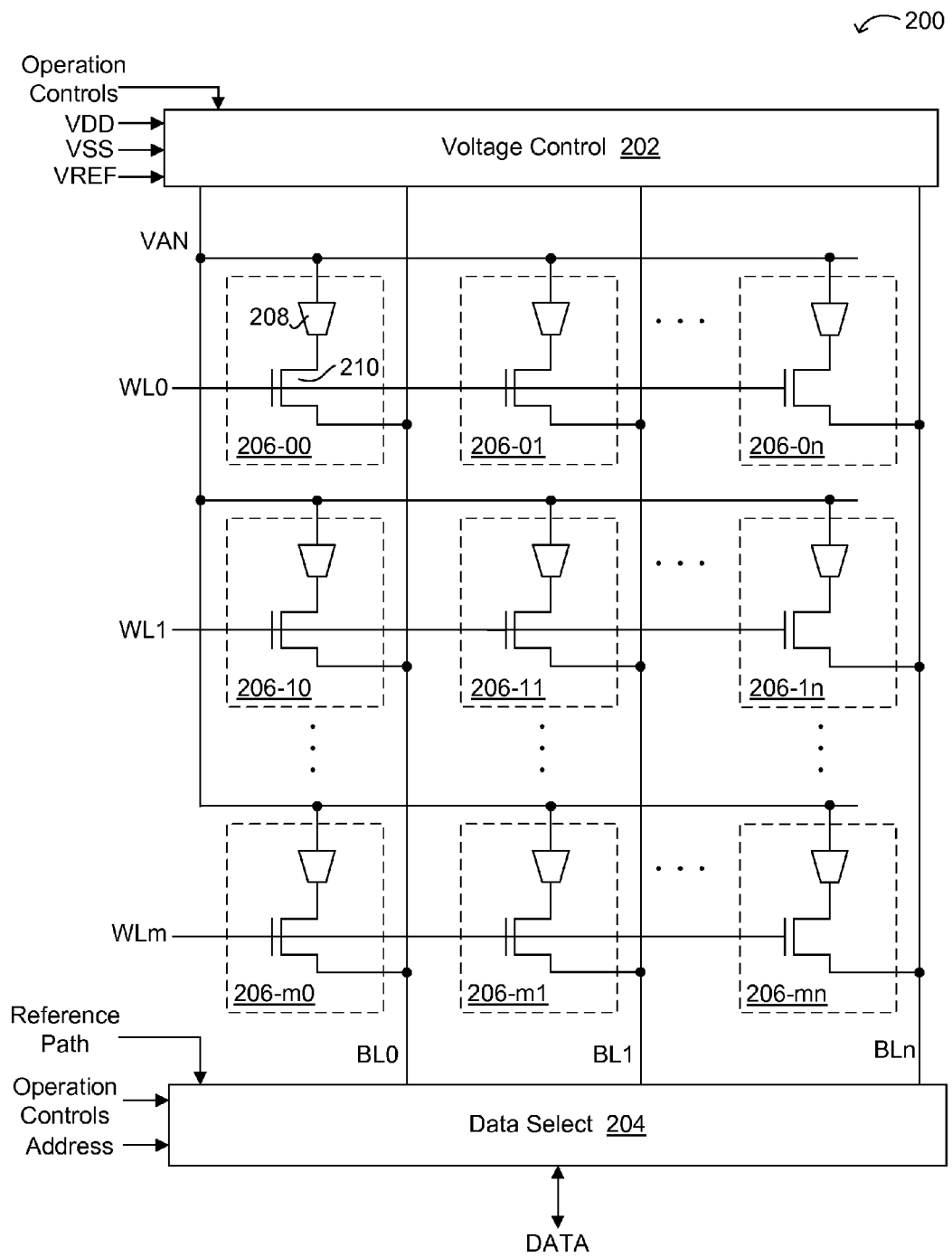
FIG. 2 is a schematic block diagram of an example common anode array structure.

FIGS. 1 and 2 show example memory architectures and circuit structures that can utilize programmable impedance elements. However, particular embodiments are amenable to a wide variety of memory architectures, circuit structures, and types of resistive switching memories.

Referring now to FIG. 1, an example memory device is shown and designated by the general reference character 100. A memory device 100 can include common anode sectors 102-0 to 102-7, bit line selection circuitry 104, common plate selection circuitry 106, anode decoding circuitry 108, word line decoding circuitry 110, and bit line decoding circuitry 112. A memory device 100 can be a single integrated circuit, or may form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

Common anode sectors (102-0 to 102-7) can each include a number of memory cells arranged into one or more columns and multiple rows, and coupled to a common anode plate. Each memory cell can include one or more programmable impedance elements or CBRAM storage elements, and a selection device. Generally, a CBRAM storage element may be configured such that when a bias greater than a threshold voltage is applied across electrodes of the CBRAM storage element, the electrical properties of the CBRAM storage element can change. For example, in some arrangements, as a voltage is applied across the electrodes of the CBRAM storage element, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

Voltages VBL_Prog, VBL_Erase, and VAN may be conventional power supply voltages, such as +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a CBRAM cell by applying suitable voltages across the electrodes thereof.

Bit line selection circuitry 104 can selectively connect bit lines of one or more common anode sections (102-0 to 102-7) according to a mode of operation and bit line decoding values. In one particular example, bit line selection circuitry 104 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Common plate selection circuitry 106, can connect anode plates to an inhibit voltage for CBRAM cells that are not selected (e.g., via anode decode 108) for erase or program.

It is noted that an arrangement like that shown in FIG. 1 can advantageously provide program and erase voltages without having to include charge pumps or the like, to a voltage that is outside a power supply range, as may exist in other approaches. Instead, supply voltages applied across a selected CBRAM device can be switched between program and erase operations. In this way, program and erase can be "symmetric" operations. That is, in a programming operation, a CBRAM cell to be programmed can be connected between suitable voltages (e.g., V1-V2) in an anode-to-cathode direction. In an erase operation, a CBRAM cell to be erased can be connected between suitable voltages (e.g., V2-V1) in a cathode-to-anode direction.

Bit line decoding circuitry 112 can generate values for selecting given bit lines for read, program, and erase operations. In one arrangement, in response to address information (e.g., column address data), bit line decoding circuitry 112 can generate bit line select signals for application to bit line select circuitry 104. Word line decoding circuitry 110 can generate values for selecting a given set of memory cells by enabling access devices in one or more selected rows of common anode sections (102-0 to 102-7). In response to address information (e.g., row address data), one or more word lines can be driven to a select voltage to thereby enable the corresponding select device (e.g., a transistor) in a row of memory cells.

Referring now to FIG. 2, shown is a schematic block diagram of an example common anode array structure 200, which can be one implementation of the example shown in FIG. 1. In this example, voltage control 202 can receive various supply voltages (e.g., VDD, VSS, VREF, etc.), as well as operation controls (e.g., program, erase, verify, read, etc.). Resistive memory cells 206 can include a programmable impedance element 208 and an access transistor 210, as shown. In this particular arrangement, the anode of each memory cell 206 can connect together in a common anode structure. For example, the common anode (AN) can be a large plate structure that may be biased at a voltage VAN generated by voltage control 202. Of course, other voltage generation control and regulated levels, as discussed above, can be utilized in certain embodiments.

Thus as shown in this particular example, common anode plates (VAN) can be shared by multiple CBRAM cells. Along these lines, each memory array or array block may have multiple such anode plates (VANs). In addition, word lines and bit lines can be arranged in an orthogonal fashion for accessing individual CBRAM or other such resistive memory cells. Of course, any number of anode plates, anode plate voltages (VANs), memory array or array block sizes, and/or memory array arrangements, etc., can be supported in particular embodiments.

In this example, data select 204 can provide an interface between the bit lines (BL0, BL1, . . . BLn) and a data path that is coupled to a sensing or amplification block, as well as to write circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed and decoded. In addition, word line (WL0, WL1, . . . WLm) decoding can be utilized for activation of the appropriate word line for a given cycle.

Further, a reference path can also be coupled to data select 204. The reference path can be used by a sensing circuit in order to compare against a regular bit line. For example, a current from a selected bit line and its selected memory cell 206 can be compared against a current from a reference bit line, where the reference bit line is biased such that appropriate data states on the selected memory cell via the selected bit line can be detected. In one application, the capacitance on the reference bit line and reference memory cell structure can match the capacitance on a regular memory cell/bit line such that these effects are negated during the sensing process.

Other architectures can also be employed with sensing circuitry, arrangements, and methods of particular embodiments. For example, a common cathode structure, whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is a strapped source structure. In any event, particular embodiments are suitable to a wide variety of resistive memory cell architectures and arrangements.

Data select 204 can also receive operation control signals. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. For example, a common bidirectional sensing circuit can be employed in each of these operations. In particular, the bidirectional sensing circuit can allow for a program verify to be performed using a same forward bias (anode voltage higher with respect to cathode voltage) on the memory cell as was used to program the memory cell. Similarly, the bidirectional sensing circuit can allow for an erase verify to be performed using a same reverse bias (cathode voltage higher with respect to anode voltage) on the memory cell as was used to erase the memory cell.

Sensing circuits in particular embodiments also aim to minimize disturbance of the accessed cell resistance during the read operation to determine a data state from that cell. Thus, a cell that is programmed (e.g., in a data state "0") should remain in that state after a program verify or standard read operation, and a cell that is erased (e.g., in a data state "1") should remain in that state after an erase verify or standard read operation. The CBRAM cell may generally be programmed with a forward bias voltage (positive with respect to anode and cathode), and may be erased with a reverse bias voltage (negative with respect to anode and cathode). Various voltages for bit lines and the common anode plate can be supported in particular embodiments. Voltages can also be changed depending on the bias direction (forward or reverse) for a read operation.

Having described the various sections of FIG. 2, one example of the operation of such a memory device will now be described with reference to an operation that accesses memory cell 206-00. Initially, word lines WL0, WL1, . . . WLm can be driven to a deselect voltage (e.g., low) by associated word line drivers. Bit line selection circuitry 104 can place bit lines BL0 and BL1 in the deselected state. Similarly, common plate selection circuitry 106 can place common anode plates in the deselect state.

In a program operation, in response to address and mode data, bit line selection signals can be used to connect a selected bit line to read/write control circuitry via data select 204. In contrast, other bit lines can be deselected, and thus placed in the deselected state. Mode selection values can result in read/write control circuitry connecting the selected bit line (e.g., BL0) to a cathode program voltage. A program operation can also include anode plate voltage VAN being connected to a program voltage, while connecting the selected bit line is grounded. A word line driver corresponding to the selected memory cell can be driven to a select voltage, thereby placing the selected memory cell between suitable programming voltages.

An erase operation can occur in the same general fashion, but with the erase voltage being applied to the selected bit line and common anode voltage VAN. As noted in the example of FIG. 1, in particular embodiments, such an operation can be symmetrical. Also, while FIG. 2 shows n-channel MOS transistors 210 as access devices, other embodiments may include different types of access devices. In such alternate embodiments, associated word line drivers would provide appropriate voltage and/or currents to enable such access devices. In this way, bit line selection, anode plate selection, and word line activation can be utilized to program and/or erase a CBRAM array having bit lines connected to cathodes of CBRAMs within multiple memory cells.

While particular example architectures and circuits suitable for CBRAMs, and memory arrays formed thereof, with respect to FIGS. 1 and 2, programmable impedance elements in certain embodiments are suitable to a wide variety of architectures and/or circuit arrangements.

Figure 3:
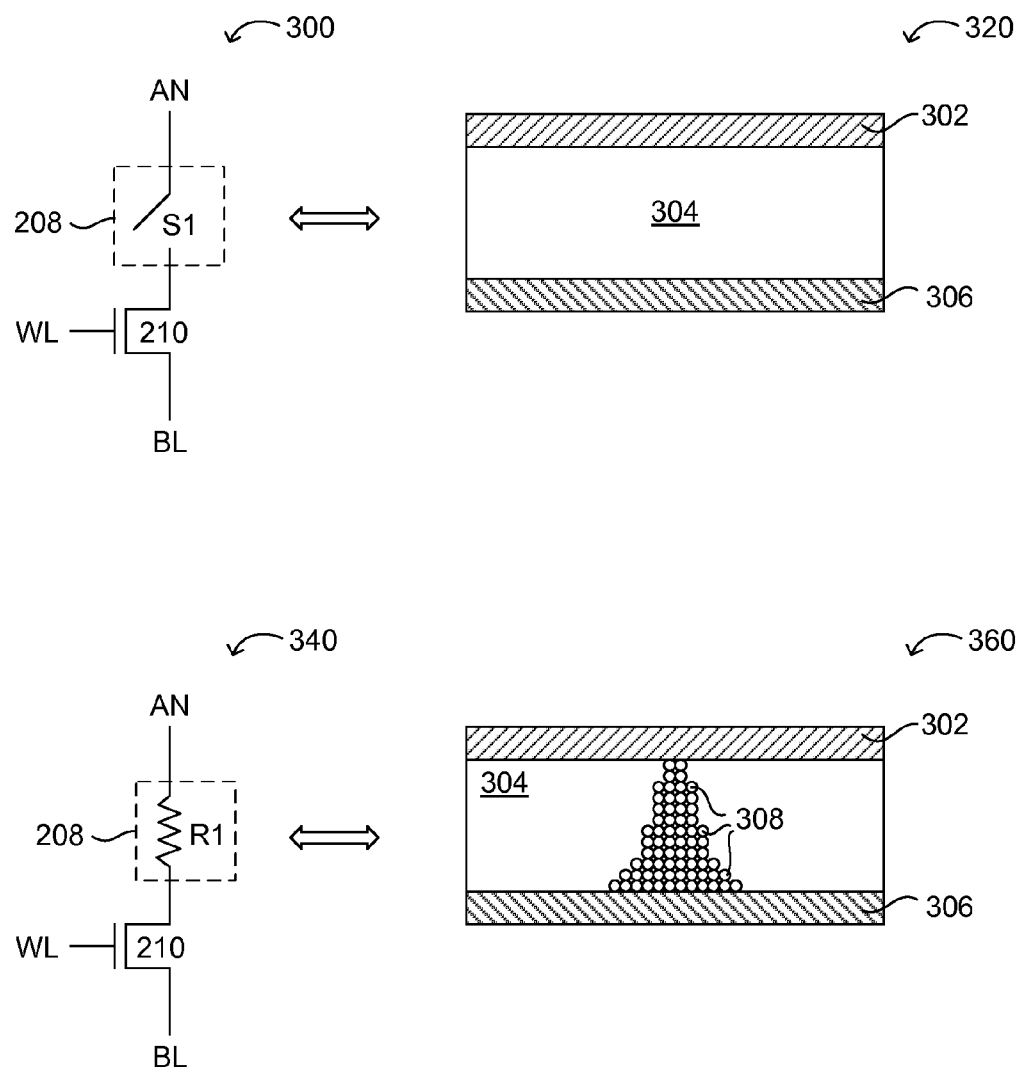
FIG. 3 is a diagram of an example programmable impedance element with schematic modeling.

Referring now to FIG. 3, shown is a diagram of an example programmable impedance element with schematic modeling. For example, example 300 shows a memory cell with an open switch S1 representation of programmable impedance element 208. The programmable impedance element or CBRAM storage element portion of this representation corresponds to the cross-section diagram 320, which represents a resistive storage element in a high impedance state (e.g., data state "1"), or an erased state. Particular embodiments can also include any type of resistive switching or resistance-change memory cells or elements. In one example, CBRAM storage element 320 can include electrochemically active electrode 302, solid electrolyte 304, and inert electrode 306. The example CBRAM storage element 320 may represent a strong or substantially erased state of the cell. As shown, substantially no conductive path between active electrode 302 and inert electrode 306 is seen in CBRAM storage element 320.

Schematic representation 340 and corresponding cross-section diagram 360 show examples of CBRAM storage element 208 in a low impedance state (e.g., data state "0"), or a programmed state. For example, example 340 shows a memory cell with a resistor R1 or closed switch representation of CBRAM storage element 208. The CBRAM storage element portion of this representation corresponds to the cross-section diagram 360. In the example 360, electrodeposits 308 can form in solid electrolyte 304 to form a "bridge" or conductive path between electrochemically active electrode 302 and inert electrode 306 to program the memory cell. For example, electrodeposits 308 can be from active electrode 302, and may include silver, copper, titanium, or tellurium, as just a few examples. As shown in example CBRAM storage element 360, a full conductive path may be formed between active electrode 302 and inert electrode 306 by electrodeposits 308.

As shown in examples 300 and 340, a control transistor (e.g., 210) can also be included in each memory cell including the programmable impedance element or CBRAM storage element 208. For example, transistor 210 can be controlled by a word line, as discussed above with respect to FIG. 2. Transistor 210 may be an access transistor to allow CBRAM storage element 208 to be programmed, read, and erased.

Cell data can be erased in similar fashion to cell programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a CBRAM storage element may be substantially symmetric to a program operation.

Example Resistive Memory Cells with Diode, Switch, and Resistor Configuration

In certain CBRAM stack configurations, a reset (e.g., an erase or transition to high impedance state) operation may utilize a substantially high current in order to change the memory state from a set (e.g., program or low impedance state) to a reset/erased state. Because the erase operation can occur in a follower configuration, in order to supply a relatively high current, the gate voltage (e.g., the word line) may be increased. However, such a bias condition may be too high for a thin oxide access transistor device when considering device reliability concerns. Further, repeating such erase operations multiple times can potentially degrade (e.g., increase leakage) and/or damage the oxide of the access transistor. In addition, the relatively high current of the erase operation can result in "reverse" program effects once reset has occurred and the cathode voltage increases to a certain level.

Figure 4:
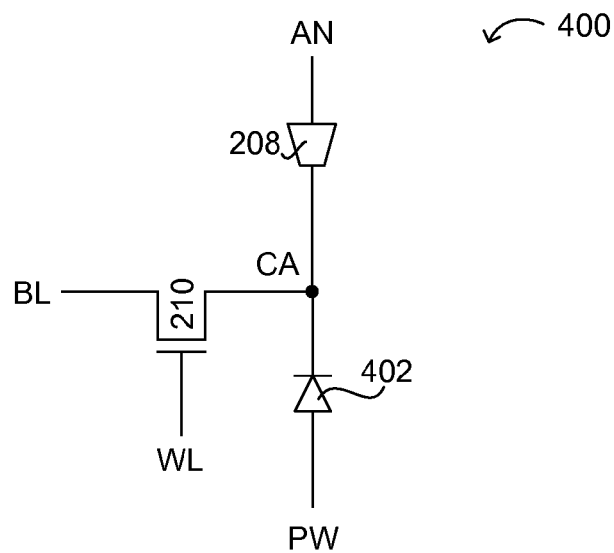
FIG. 4 is schematic block diagram of example resistive switching memory cell with diode architecture, in accordance with embodiments of the present invention.
Figure 4:
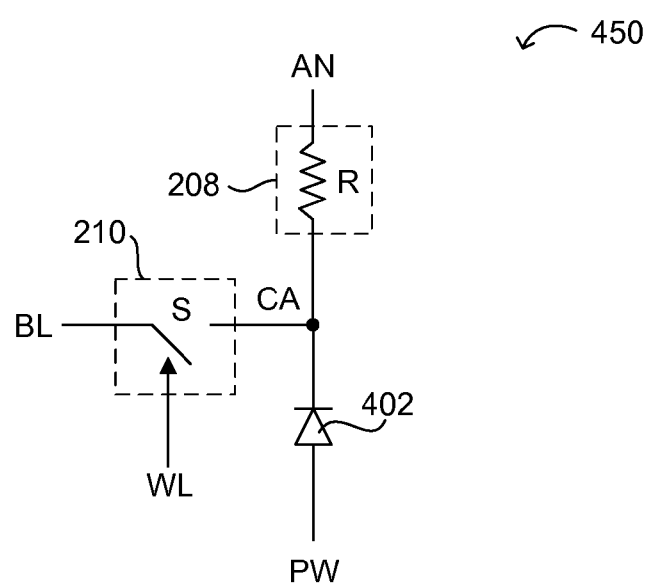

Referring now to FIG. 4, shown is schematic block diagram of example resistive switching memory cell with diode architecture, in accordance with embodiments of the present invention. In example resistive switching memory cell 400, the anode AN (e.g., for a common anode architecture) can connect to the anode of programmable impedance element 208, and the cathode CA can be at a common node with access transistor 210 and diode 402. For example, access transistor 210 can be controlled by the word line, and may have a drain that can connect to the bit line, and a source that can connect to the common node. Also, diode 402 can have an anode connected to the PWELL (PW), and a cathode connected to the common node.

Example 450 shows a circuit representation of the resistor, diode, and switch elements of the resistive switching memory cell of certain embodiments. For example, programmable impedance element 208 (e.g., CBRAM resistive element) can be represented at resistor R, and diode 402 can be represented as shown. Also, access transistor 210 can be represented as switch S, which is controllable by the word line (WL). Here, R can serve as a memory element that can be set (e.g., programmed) or reset (e.g., erased) depending on the input data. Further, diode 402 can provide or serve as a high current path, such as for erase operations. Also, switch S can provide selection for read operations, and for a low current path, such as for program and read (e.g., verify) operations.

In one embodiment, a semiconductor memory device includes a plurality of resistive switching memory cells, where each resistive switching memory cell can include: (i) a programmable impedance element having an anode and a cathode; (ii) an access transistor having a drain coupled to a bit line, a source coupled to the programmable impedance element cathode, and a gate coupled to a word line; (iii) a well having a first diffusion region configured as the source, a second diffusion region configured as the drain, and a third diffusion region configured as a well contact; and (iv) a diode having a cathode at the second diffusion region, and an anode at the third diffusion region, where the diode is turned on during an erase operation on the programmable impedance element.

Figure 5:
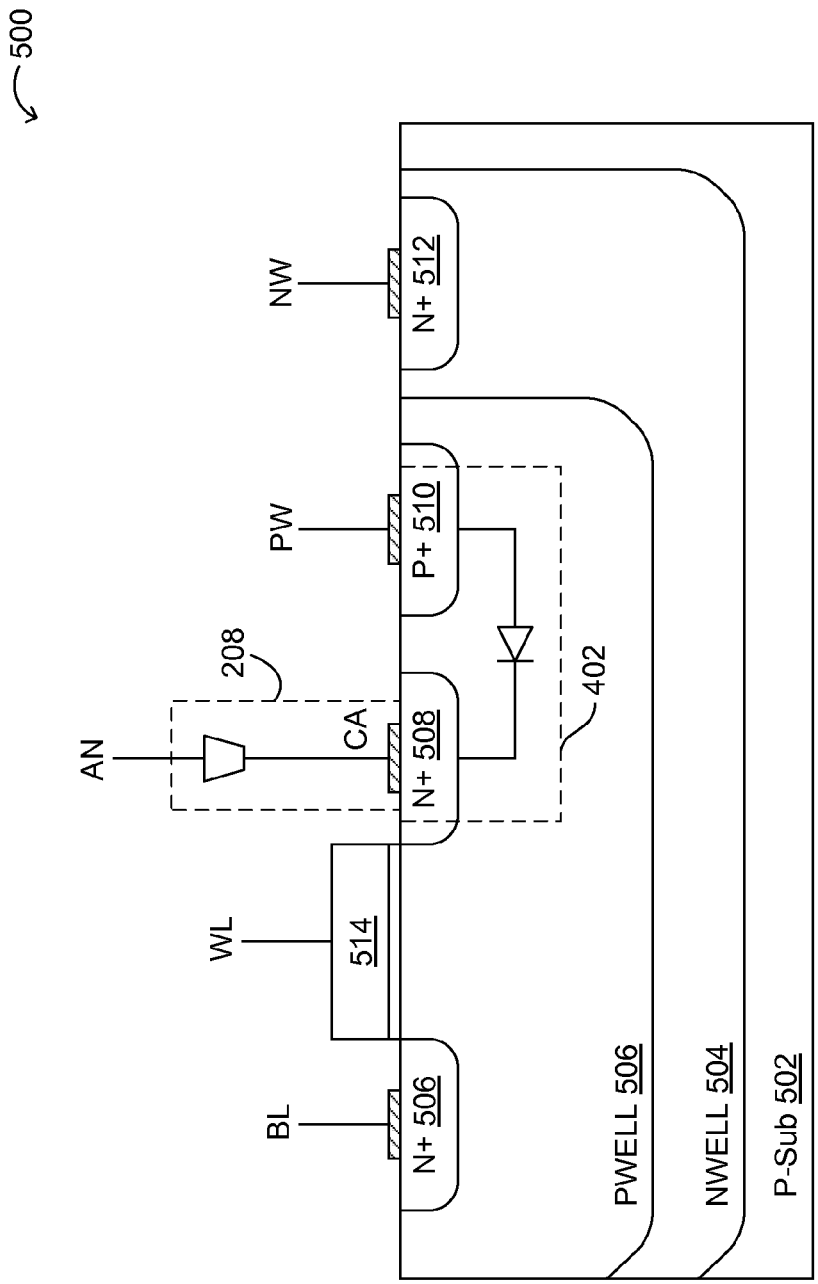
FIG. 5 is a cross-section diagram of an example resistive switching memory cell implementation in a triple well process, in accordance with embodiments of the present invention.

Referring now to FIG. 5, shown is a cross-section diagram of an example resistive switching memory cell implementation in a triple well process, in accordance with embodiments of the present invention. Example 500 can be formed in a triple wells process, where PWELL 506 is accessible for implementation of diode 402 between PWELL 506 (at P+ 510) and implant N+ 508. NWELL 504 can be disposed in P-substrate 502, and PWELL 506 can be disposed in NWELL 504. Diffusion region 506 can include an N-type implant, and may form the drain of the access transistor, which can connect to the bit line. Diffusion region 508 can also include an N-type implant, and may form the source of the access transistor, which can also connect to the cathode of programmable impedance element 208. Of course, the source and drain allocations can be reversed in the MOS access transistor.

In this example, the anode of programmable impedance element 208 can be shared among other cells in a common anode architecture. As will be discussed in more detail below, other architectures and/or circuit structures, such as a common cathode architecture, can also be supported in particular embodiments. Diffusion region 510 can include a P-type implant, and may form a well contact for PWELL 506. Also, diffusion region 512 can include an N-type implant, and may form a well contact for NWELL 504. In addition, the word line can connect to gate (e.g., polysilicon) 514. Also as will be discussed in more detail below, different structures as to well sharing and arrangement with respect to the word lines can also be supported in particular embodiments.

Figure 6:
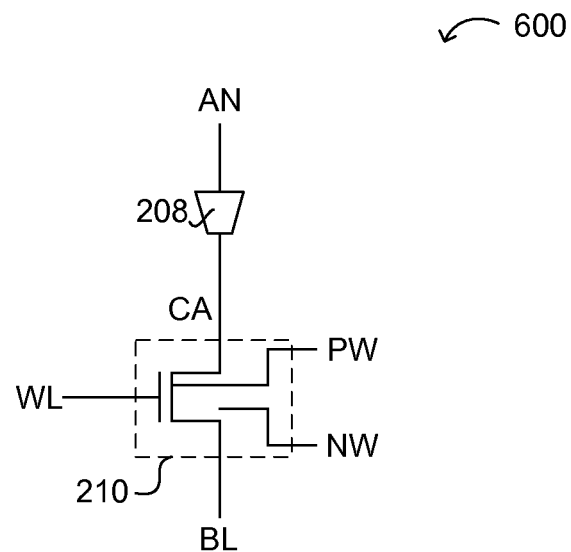
FIG. 6 is schematic block diagram of an example resistive switching memory cell with diode circuitry, in accordance with embodiments of the present invention.
Figure 6:
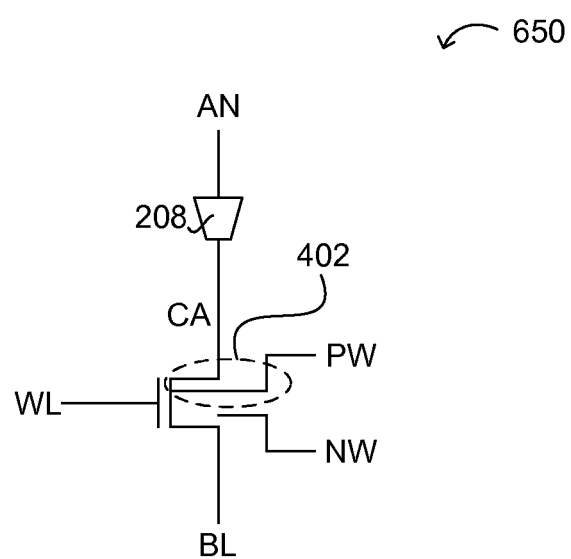

Referring now to FIG. 6, shown is schematic block diagram of an example resistive switching memory cell with diode circuitry, in accordance with embodiments of the present invention. Example 600 shows a resistive switching memory cell with access transistor 210 having NW (e.g., NWELL 504) and PW (e.g., PWELL 506) connections. Example 650 shows the resistive switching memory cell with diode 402 formed via access transistor 210 (e.g., at N+ 508) and the PW contact (e.g., P+ 510). Table 1 below shows example voltages on the various terminals of this circuit configuration for different operations.

TABLE 1

| Mode | AN | WL | BL | PW | NW |
|---|---|---|---|---|---|
| Standby | 0 | 0 | 0 | 0 | VCC |
| Read | 0 | 1.2 | 0.2 | 0 | VCC |
| Program | 2.8 | 1.2 | 0 | 0 | VCC |
| Erase | 0 | 0 | 2.8 | 2.8 | 2.8 |

Figure 7:
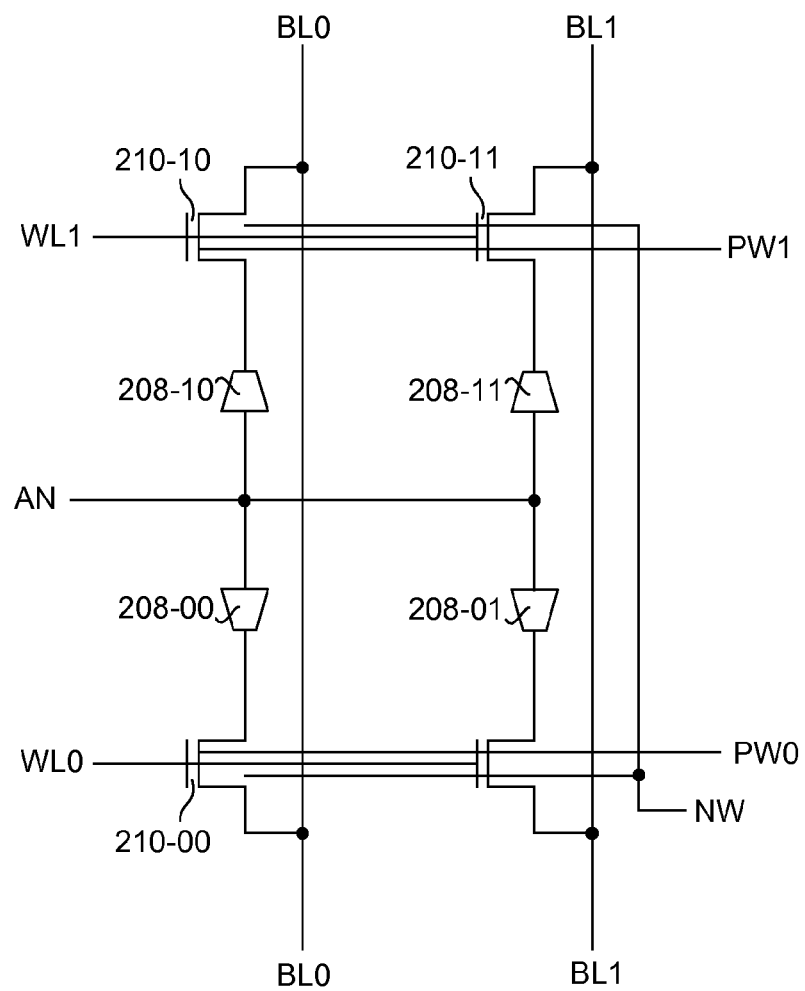
FIG. 7 is a schematic block diagram of an example resistive switching memory array structure with independent PWELL control, in accordance with embodiments of the present invention.

Referring now to FIG. 7, shown is a schematic block diagram of an example resistive switching memory array structure with independent PWELL control, in accordance with embodiments of the present invention. In example 700, the PWELLs can be separated and arranged one per word line. That is, the access transistors that share a common word line can also share a PWELL, and those access transistors along a different word line may be disposed in a different PWELL. Thus in example 700, WL0 can connect to access transistors 210-00 and 210-01, and these transistors can also have a shared well with well contact PW0. Also, WL1 can connect to access transistors 210-10 and 210-11, and these transistors can also have a shared well with well contact PW1.

The anodes of programmable impedance elements 208-00, 208-01, 208-10, and 208-11 can be connected together in a common anode architecture. Also, each of the resistive memory cells can share a common NWELL with well contact NW. Of course, this structure can be repeated for larger arrays in subsets of four resistive memory cells. In other approaches, the NWELLs may be separated and/or the PWELLs may be separated or arranged in another configuration (e.g., along a common bit line). Table 2 below shows example voltages on the various terminals of this circuit configuration of common PWELLs arranged along a corresponding word line, for different operations (e.g., program, erase, etc.).

TABLE 2

| Mode | AN | WL0 | BL0 | WL1 | BL1 | PW0 | PW1 | NW |
|---|---|---|---|---|---|---|---|---|
| Standby | 0 | 0 | 0 | 0 | 0 | 0 | 0 | VCC |
| Read | 0 | 1.2 | 0.2 | 0 | 0 | 0 | 0 | VCC |
| Program | 2.8 | 1.2 | 0 | 0 | 2.8 | 0 | 0 | VCC |
| Erase | 0 | 0 | 1.7 | 0 | 1.7 | 1.7 | 0 | 1.7 |

Figure 8:
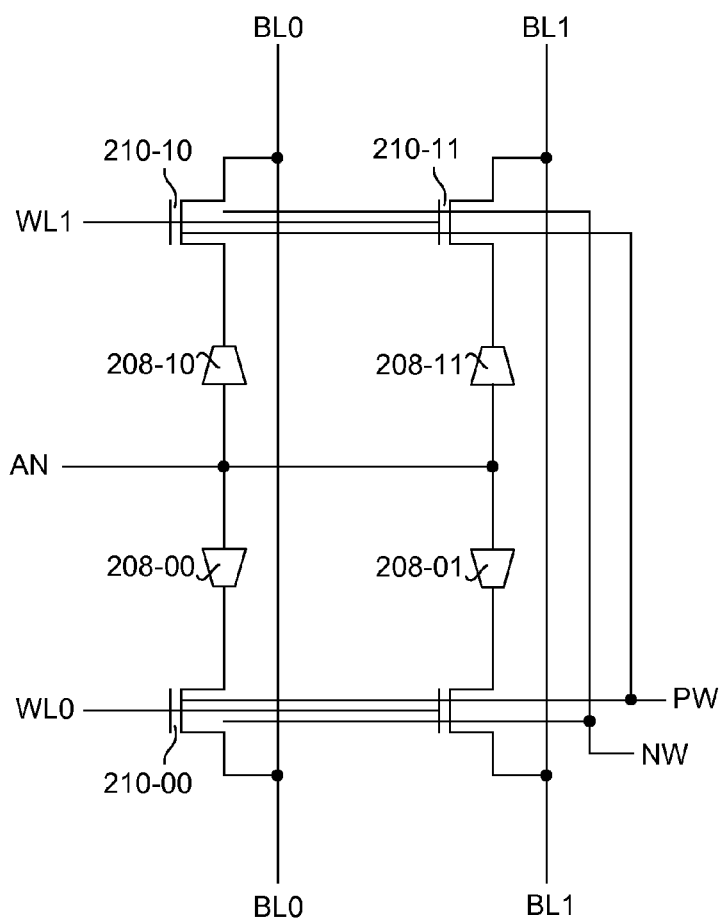
FIG. 8 is a schematic block diagram of an example resistive switching memory array structure with common PWELL control, in accordance with embodiments of the present invention.

Referring now to FIG. 8, shown is a schematic block diagram of an example resistive switching memory array structure with common PWELL control, in accordance with embodiments of the present invention. In example 800, the PWELL and NWELL can be shared among the four resistive memory cells. Here, WL0 can connect to access transistors 210-00 and 210-01, and these transistors can also have a shared well with well contact PW. Also, WL1 can connect to access transistors 210-10 and 210-11, and these transistors can also have the same shared well with well contact PW. The anodes of programmable impedance elements 208-00, 208-01, 208-10, and 208-11 can be connected together in a common anode architecture. Also, each of the resistive memory cells can share a common NWELL with well contact NW. Of course, this structure can be repeated for larger arrays in subsets of four resistive memory cells. Table 3 below shows example voltages on the various terminals of this circuit configuration for different operations.

TABLE 3

| Mode | AN | WL0 | BL0 | WL1 | BL1 | PW | NW |
|---|---|---|---|---|---|---|---|
| Standby | 0 | 0 | 0 | 0 | 0 | 0 | VCC |
| Read | 0 | 1.2 | 0.2 | 0 | 0 | 0 | VCC |
| Program | 2.8 | 1.2 | 0 | 0 | 2.8 | 0 | VCC |
| Erase | 0 | 0 | 1.7 | 0 | 1.7 | 1.7 | 1.7 |

Figure 9:
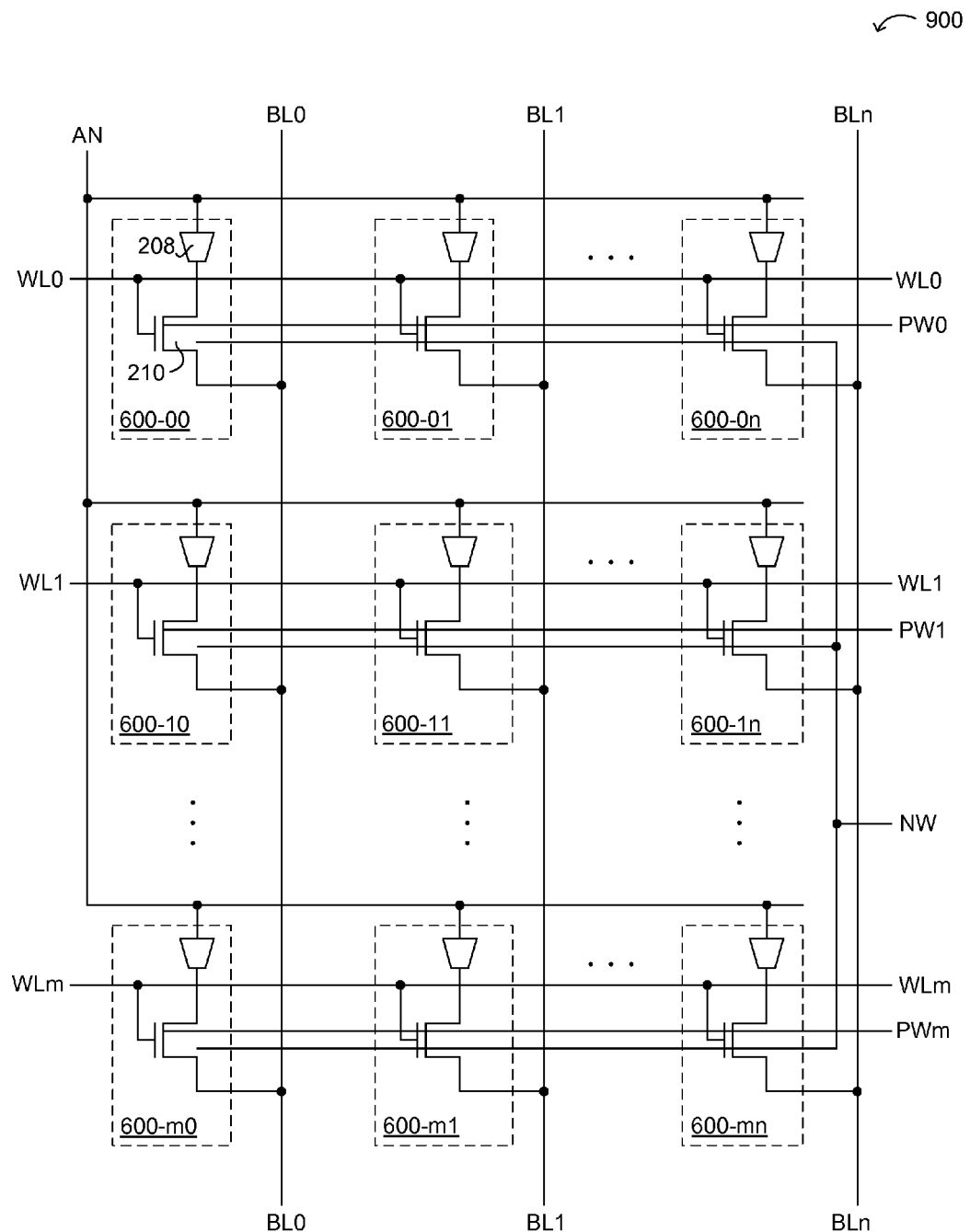
FIG. 9 is a schematic block diagram of an example large resistive switching memory array structure with independent PWELL control, in accordance with embodiments of the present invention.

Referring now to FIG. 9, shown is a schematic block diagram of an example large resistive switching memory array structure with independent PWELL control, in accordance with embodiments of the present invention. This particular example shows a larger memory array structure based on the PWELL being segmented along word line structure of FIG. 7, for a set of four resistive memory cells. This example array may also interface with voltage control circuitry, data select circuitry, etc., such as discussed above with respect to FIG. 2. Of course, any number of resistive memory cells, as well as some arrangements that include switch (e.g., transistor), resistor (e.g., CBRAM element), and diode elements, can be supported in particular embodiments.

In example 900, voltage control 202 (see, e.g., FIG. 2) can receive various supply voltages (e.g., VDD, VSS, VREF, etc.), as well as operation controls (e.g., program, erase, verify, read, etc.), and may be used to control certain voltage levels, such as the anode voltage level, and the bit line levels for various modes of operation. Resistive memory cells 600 can each include a programmable impedance element 208 and an access transistor 210, as shown. In this particular arrangement, the anode of each memory cell 600 can connect together in a common anode structure. For example, the common anode (AN) can be a large plate structure that may be biased at a voltage VAN generated by voltage control 202 (see, e.g., FIG. 2). Of course, other voltage generation control and regulated levels, as discussed above, can be utilized in certain embodiments.

In this example, data select 204 (see, e.g., FIG. 2) can provide an interface between the bit lines (BL0, BL1, . . . BLn) and a data path that is coupled to a sensing or amplification block, as well as to write (program/erase) circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed and decoded. In addition, word line (WL0, WL1, . . . WLm) decoding can be utilized for activation of the appropriate word line for a given cycle.

Also in this example, selection circuitry can be used to control the PWELL connections (PW0, PW1, . . . PWm) for the various operating modes. For example, deselected PWELLs can be at a low or grounded level, and this state can also be employed for program and read operations. However, in erase operations, the selected PWELL (e.g., along a selected word line) can be brought to a voltage level suitable for application of an erasing voltage in reverse bias across the programmable impedance element. In this fashion, the diode path (see, e.g., 402 in FIG. 5) can be utilized for erasing or resetting the memory cell. In some cases, the access transistor and bit line path can additionally be employed in the erase operation, such that the current burden is spread between access transistor 210 and diode 402. In any event, PWELL control can be employed particularly for erase operations.

Further, a reference path can also be coupled to data select 204. The reference path may mimic a circuit portion shown in FIG. 9, and can be used by a sensing circuit in order to compare against a regular bit line. For example, a current from a selected bit line and its selected memory cell 600 can be compared against a current from a reference bit line, where the reference bit line is biased such that appropriate data states on the selected memory cell via the selected bit line can be detected, such as in a read/verify operation. In one application, the capacitance on the reference bit line and reference memory cell structure can match the capacitance on a regular memory cell/bit line such that these effects are negated during the sensing process.

Other architectures can also be employed with sensing circuitry, arrangements, and methods of particular embodiments. For example, a common cathode structure (see, e.g., FIG. 12), whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is a strapped source structure. In any event, particular embodiments are suitable to a wide variety of resistive memory cell architectures and arrangements.

Data select 204 (see, e.g., FIG. 2) can also receive operation control signals, and can be coupled to the bit lines. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. For example, a common bidirectional sensing circuit can be employed in each of these operations. In particular, the bidirectional sensing circuit can allow for a program verify to be performed using a same forward bias (anode voltage higher with respect to cathode voltage) on the memory cell as was used to program the memory cell. Similarly, the bidirectional sensing circuit can allow for an erase verify to be performed using a same reverse bias (cathode voltage higher with respect to anode voltage) on the memory cell as was used to erase the memory cell.

Sensing circuits in particular embodiments also aim to minimize disturbance of the accessed cell resistance during the read operation to determine a data state from that cell. Thus, a cell that is programmed (e.g., in a data state "0") should remain in that state after a program verify or standard read operation, and a cell that is erased (e.g., in a data state "1") should remain in that state after an erase verify or standard read operation. The CBRAM cell may generally be programmed with a forward bias voltage (positive with respect to anode and cathode), and may be erased with a reverse bias voltage (negative with respect to anode and cathode). Various voltages for bit lines and the common anode plate can be supported in particular embodiments. Voltages can also be changed depending on the bias direction (forward or reverse) for a read operation.

Having described the various sections of FIGS. 2 and 9, one example of the operation of such a memory device will now be described with reference to an operation that accesses memory cell 600-00. Initially, word lines WL0, WL1, . . . WLm can be driven to a deselect voltage (e.g., low) by associated word line drivers. Bit line selection circuitry 104 (see, e.g., FIG. 1) can place bit lines BL0 and BL1 in the deselected state. Similarly, common plate selection circuitry 106 (see, e.g., FIG. 1) can place common anode plates in the deselect state. Also, the PWELL connections can be grounded. This deselect state can also be indicated by the standby values, as shown in Table 2 above.

In a program operation, in response to address and mode data, bit line selection signals can be used to connect a selected bit line to read/write control circuitry via data select 204. In contrast, other bit lines can be deselected, and thus placed in the deselected state. Mode selection values can result in read/write control circuitry connecting the selected bit line (e.g., BL0) to a cathode program voltage. A program operation can also include anode plate voltage VAN being connected to a program voltage, while connecting the selected bit line is grounded. Also, the PWELL connection can be grounded. A word line driver corresponding to the selected memory cell can be driven to a select voltage (e.g., a voltage at least a threshold of the access transistor), thereby placing the selected memory cell between suitable programming voltages. This operation can also be indicated by the program values, as shown in Table 2 above. In this way, the access transistor can couple the selected bit line to the selected programmable impedance element, in order to provide the appropriate programming voltages for the memory cell.

An erase operation can occur in a different fashion, with the erase voltage being applied to the selected PWELL and common anode voltage VAN, in order to reverse bias programmable impedance element 208. In an erase operation, in response to address and mode data, bit line selection signals can be used to connect a selected bit line to read/write control circuitry via data select 204, and other bit lines can be deselected, and thus placed in the deselected state. Mode selection values can result in read/write control circuitry connecting the selected bit line (e.g., BL0) to a cathode erase voltage. An erase operation can also include the anode plate voltage, and in some cases, the selected word line being grounded. This is to allow the diode path to provide the bulk of the current for the erase operation, as opposed to by way of access transistor 210.

Also in the erase operation, the PWELL connection can be brought to a high value, in order to provide an erasing voltage across the selected programmable impedance element. A word line driver corresponding to the selected memory cell can be driven to a deselect voltage (e.g., grounded) along with the anode plate voltage, thereby placing the selected memory cell between suitable erasing voltages by way of the diode path. This operation can also be indicated by the example erase values, as shown in Table 2 above. In some cases, the erasing current burden can be spread among the access transistor and the diode, and the word line can be at least partially activated. In any event, the diode path can be utilized to provide a significant portion of the erasing current. Thus, the access transistor and/or the diode can couple the selected bit line to the selected programmable impedance element, in order to provide the appropriate erasing voltages for the memory cell.

In a read operation, in response to address and mode data, bit line selection signals can be used to connect a selected bit line to read/write control circuitry via data select 204. In contrast, other bit lines can be deselected, and thus placed in the deselected state. Mode selection values can result in read/write control circuitry connecting the selected bit line (e.g., BL0) to a read voltage. A read operation can also include anode plate voltage VAN and the PWELL connection being grounded. A word line driver corresponding to the selected memory cell can be driven to a select voltage (e.g., a voltage at least a threshold of the access transistor), thereby placing the selected memory cell between suitable reading voltages. This operation can also be indicated by the read values, as shown in Table 2 above. In this way, the access transistor can couple the selected bit line to the selected programmable impedance element, in order to provide the appropriate reading voltages for the memory cell.

Also, while FIG. 9 shows n-channel MOS transistors 210 as access devices, other embodiments may include different types of access devices (e.g., PMOS access transistors in a common cathode configuration). In such alternate embodiments, associated word line drivers would provide appropriate voltage and/or currents to enable such access devices. In this way, bit line selection, anode plate selection, PWELL selection, and word line activation can be utilized to program and/or erase a CBRAM array having bit lines and PWELLs effectively connected to cathodes of CBRAMs within multiple memory cells.

Figure 10:
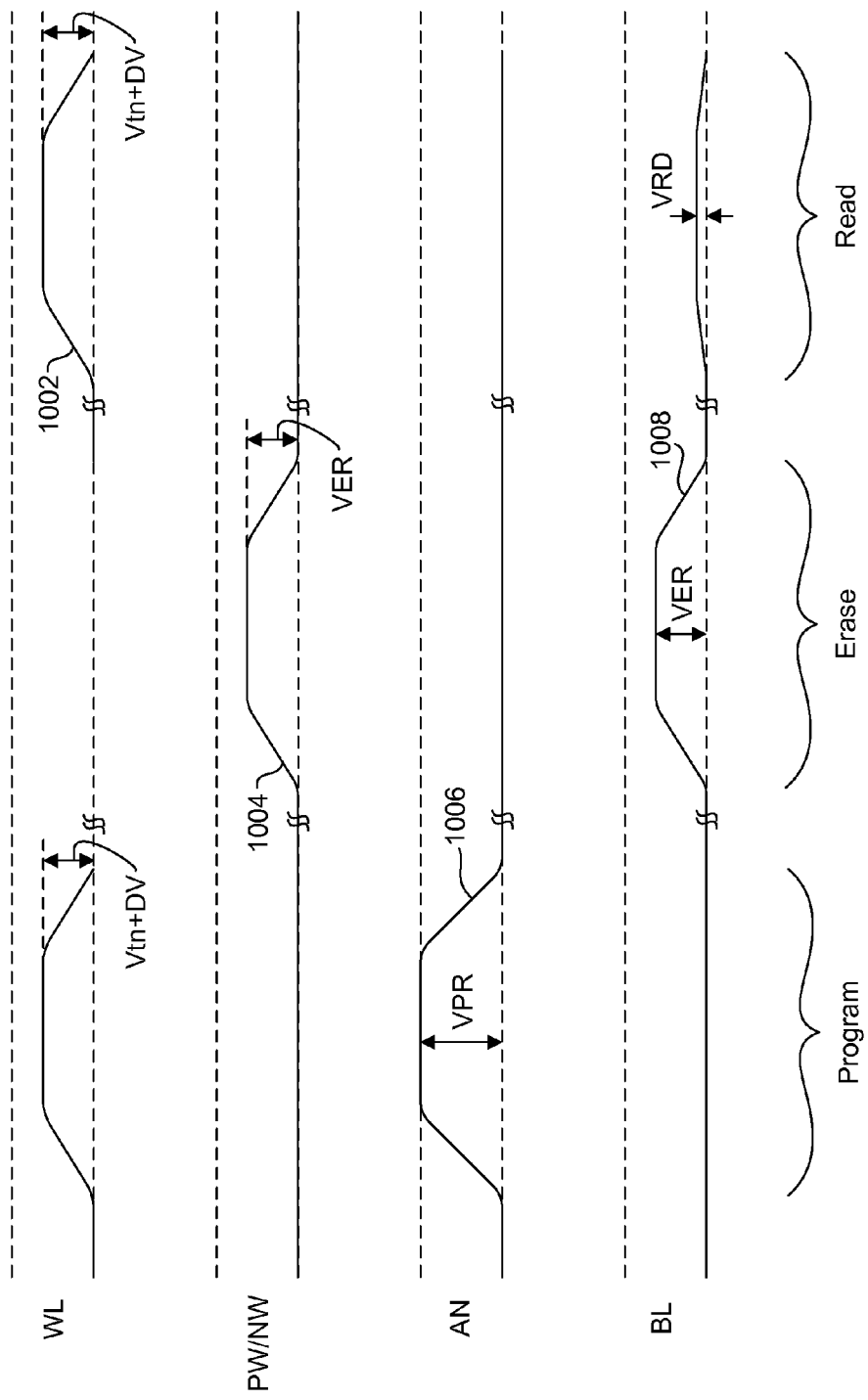
FIG. 10 is a waveform diagram of example operation of a resistive switching memory array with diodes used for erase operations, in accordance with embodiments of the present invention.

Referring now to FIG. 10, shown is a waveform diagram of example operation of a resistive switching memory array with diodes used for erase operations, in accordance with embodiments of the present invention. For a program operation, the word line for the selected cell can go to a level of Vtn+DV (e.g., a delta voltage over the access transistor threshold voltage), as shown in waveform 1002. Thus, the voltage on an activated word line can be at least as high as the access transistor threshold voltage, in order to turn the access transistor on. The PWELL connection (PW) can remain low for the program operation, as shown in waveform 1004, because the diode may remain off during the program operation. Also for the program operation, the anode can go high (see, e.g., waveform 1006), and the bit line can be low (see, e.g., waveform 1008), in order to provide the programming voltage (VPR) in a forward bias across the selected memory cell.

In the erase operation, the diode can be utilized to provide high current to erase the cell in a reverse bias across the programmable impedance element. For an erase operation, the word line for the selected cell can be low, as shown in waveform 1002, in order to keep the access transistor off, thus allowing the diode path to provide appropriate biasing on the cathode. However, in other cases, the word line can be at least partially on in order for the access transistor to also share some of the erasing current burden. The PW can go high (e.g., VER) in order to reverse bias the programmable impedance element for the erase operation, as shown in waveform 1004. Thus in this case, the PW connection can be employed to provide the erasing voltage to the cathode of the programmable impedance element.

In addition, the voltage applied to the PW connection can in some cases the increased by the diode drop of diode 402, in order to allow a full erasing voltage to be applied in reverse bias fashion across the memory cell. Thus, the VER voltage as indicated may represent an erasing voltage plus a diode drop voltage. Also, the erasing voltage may be lower than in other cell structures because the diode path can support increased erasing current. The anode of the programmable impedance element can go low for the erase operation, as shown in waveform 1006, to allow for reverse biasing. Also, the bit line can be high for the erase operation (see, e.g., waveform 1008), and in fact may be to the same level as the PW connection in order to not forward bias the diode between the PW connection and N+ region 506 (see, e.g., FIG. 5) at the bit line connection.

For a read operation, the word line for the selected cell can go to a level of Vtn+DV (see, e.g., waveform 1002) in order to turn on the access transistor. The PW connection can remain low for the read operation, as shown in waveform 1004. The anode can also be low for the read operation, as shown in waveform 1006. Also, the bit line can be at a read voltage (e.g., 200 mV) for a read operation, as shown in waveform 1008. Thus, this example read operation is a reverse bias read, such as may be suitable for an erase verify operation. However, other configurations for the read operation, such as by application of a read voltage at the anode while grounding the bit line, can also be accommodated in particular embodiments.

In one embodiment, a method of controlling a resistive switching memory cell, can include: (i) determining if a command to executed on the resistive switching memory cell is a read operation, a program operation, or an erase operation, where the resistive switching memory cell can include: a programmable impedance element having an anode and a cathode; an access transistor having a drain coupled to a bit line, a source coupled to the programmable impedance element cathode, and a gate coupled to a word line; a well having a first diffusion region configured as the source, a second diffusion region configured as the drain, and a third diffusion region configured as a well contact; and a diode having an anode at the second diffusion region, and a cathode at the third diffusion region; (ii) turning on the word line for the program operation and the read operation; (iii) turning off the word line for the erase operation; and (iv) turning on the diode for the erase operation.

Figure 11:
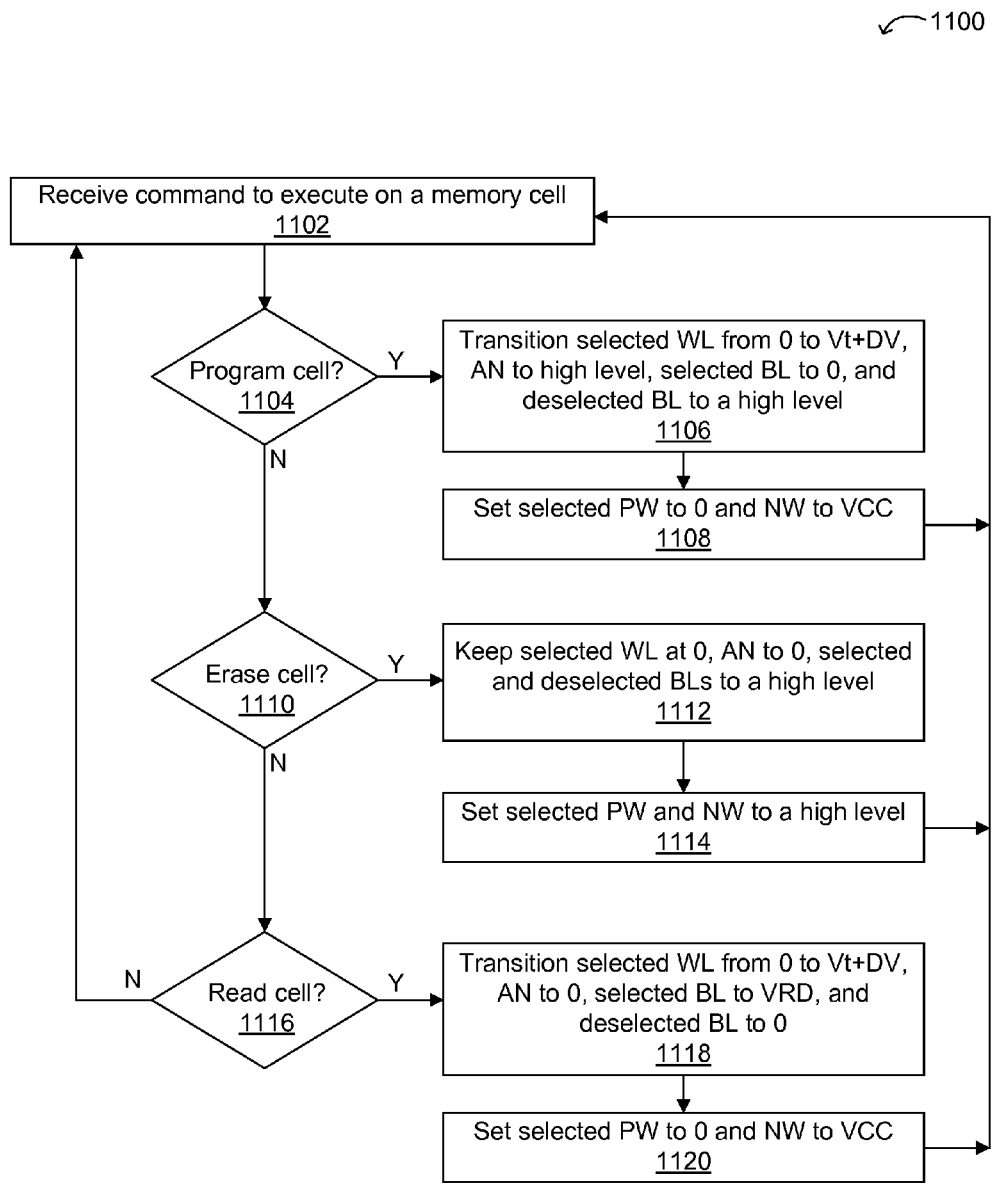
FIG. 11 is a flow diagram of example operation of a resistive switching memory array with diodes used for erase operations, in accordance with embodiments of the present invention.

Referring now to FIG. 11, shown is a flow diagram 1100 of example operation of a resistive switching memory array with diodes used for erase operations, in accordance with embodiments of the present invention. At 1102, a command to be executed on a resistive memory cell can be received and decoded (e.g., via command decoder 120). If the command is a program operation at 1104, at 1106, the selected word line and the anode can go high, the selected bit line can go low, and the deselected bit lines can go high. The deselected bit lines may be high so as to not disturb the deselected memory cells. At 1108, the selected PW can go low and the NW can remain high. In this way, a programming voltage can be applied in a forward bias across the selected memory cell.

If the command is an erase operation at 1110, at 1112, the selected word line and the anode can go low, and the selected deselected bit lines can go high. At 1114, the selected PW can go high, and the NW can remain high. In this way, an erasing voltage can be applied in a reverse bias across the selected memory cell, and the diode path can be utilized for the erase current. Also in some cases, the access transistor can be employed in the erase operation by at least partially activating the word line. However, in most cases, only the diode path can be utilized for erase operations by bringing the selected PW high, and keeping a low level on the anode plate voltage. If the command is a read operation at 1116, at 1118, the selected word line can go high and the anode can go low, the selected bit line can go to the read voltage, and the deselected bit lines can go low. At 1120, the selected PW can go low and the NW can remain high. In this way, a reverse bias read suitable for erase verify operations can be supported.

By taking advantage of high conductance gain of the diode, the diode path (e.g., via diode 402) can be dedicated for reset/erase operations, and the access transistor path can be utilized for both set/program and read operations. As discussed above, particular embodiments can also support operating mode whereby both the access transistor path and the diode path are employed in erase operations. However, due to the PWELL spacing rule, byte-erase implementation may limit array efficiency when supporting use of the diode path. In one approach to address array efficiency limitations of this approach, bytes can be grouped into blocks in order to reduce the number of sub-blocks in the architecture.

In one embodiment, a semiconductor memory device includes a plurality of resistive switching memory cells, where each resistive switching memory cell can include: (i) a programmable impedance element having an anode and a cathode; (ii) an access transistor having a source coupled to a bit line, a drain coupled to the programmable impedance element anode, and a gate coupled to a word line; (iii) a well having a first diffusion region configured as the source, a second diffusion region configured as the drain, and a third diffusion region configured as a well contact; and (iv) a diode having an anode at the second diffusion region, and a cathode at the third diffusion region, where the diode is turned on during an erase operation on the programmable impedance element.

Figure 12:
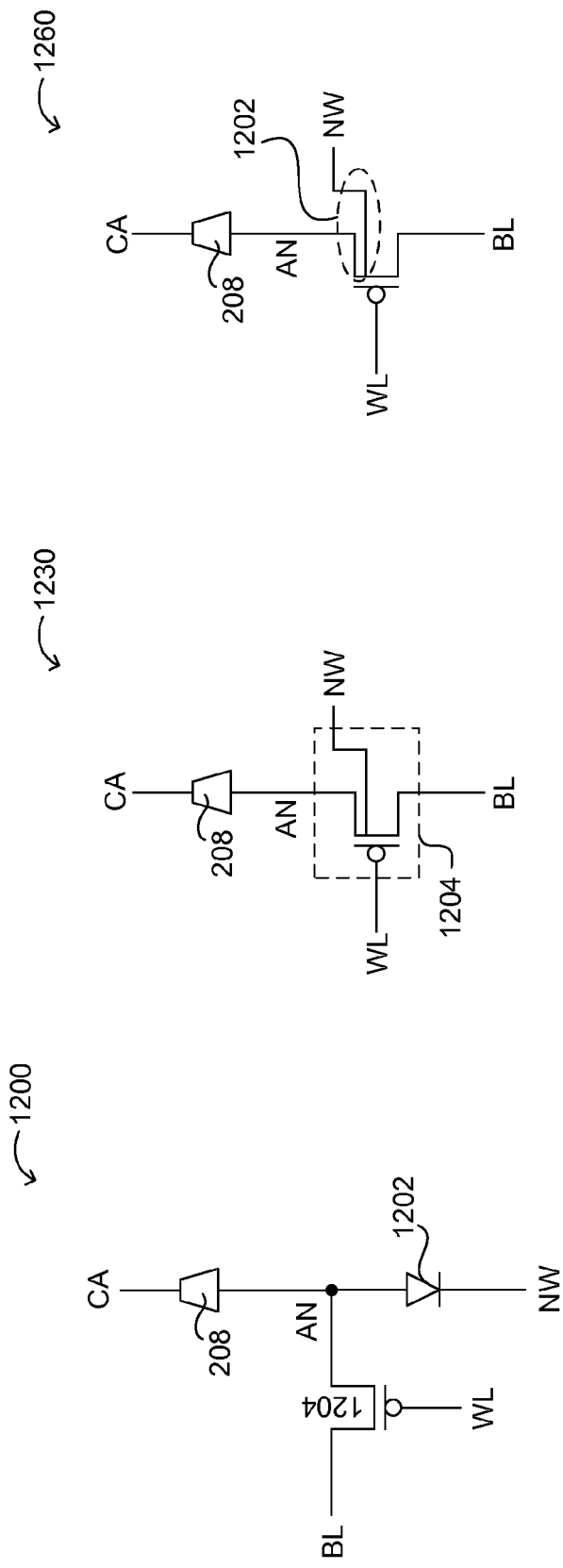
FIG. 12 is a schematic diagram of example resistive switching memory cells in a common cathode configuration, in accordance with embodiments of the present invention.

Referring now to FIG. 12, shown is a schematic diagram of example resistive switching memory cells in a common cathode configuration, in accordance with embodiments of the present invention. In example resistive switching memory cell 1200, the cathode CA (e.g., for a common cathode architecture) can connect to the cathode of programmable impedance element 208, and the anode AN can be a common node with access transistor 1204 (e.g., a PMOS transistor) and diode 1202. For example, access transistor 1204 can be controlled by the word line, and may have a source that can connect to the bit line, and a drain that can connect to the common node. Diode 1202 can have an anode connected to the common node, and a cathode connected to the NWELL (NW). Example 1230 shows a resistive switching memory cell with access transistor 1204 having an NW connection. Example 1260 shows the resistive switching memory cell with diode 1202 formed via access transistor 210 and the NW contact.

Figure 13:
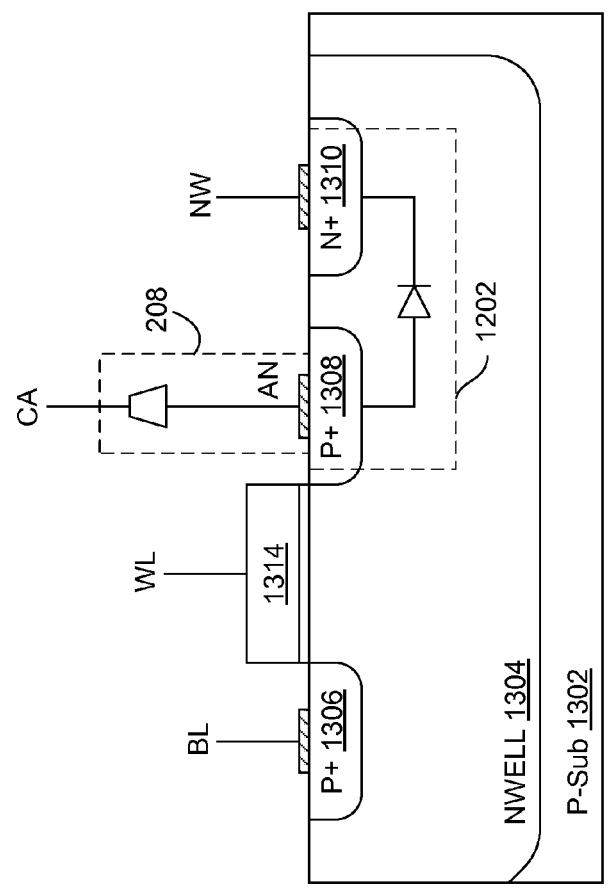
FIG. 13 is a cross-section diagram of an example resistive switching memory cell implementation with a PMOS access transistor with common cathode, in accordance with embodiments of the present invention.

Referring now to FIG. 13, shown is a cross-section diagram of an example resistive switching memory cell implementation with a PMOS access transistor with common cathode, in accordance with embodiments of the present invention. In example 1300, NWELL 1304 is accessible for implementation of diode 1202 between implant P+ 1308 and NWELL 1304, which can be disposed in P-substrate 1302. Diffusion region 1306 can include a P-type implant, and may form the source of the access transistor, which can connect to the bit line. Diffusion region 1308 can also include a P-type implant, and may form the drain of the access transistor, which can connect to the anode of programmable impedance element 208.

The cathode of programmable impedance element 208 can be shared among other cells in a common cathode architecture. Diffusion region 1310 can include an N-type implant, and may form a well contact for NWELL 1304. In addition, the word line can connect to gate 1314. In the erase operation in this configuration, the cathode can be high, and the NW connection may be brought to a level at least a diode drop below the anode voltage in order to turn on diode 1202, and such that an erasing voltage is applied in a reverse bias fashion across the programmable impedance element 208. Also, the word line may be high in order to keep access transistor 1204 off during the erase operation.

Figure 14:
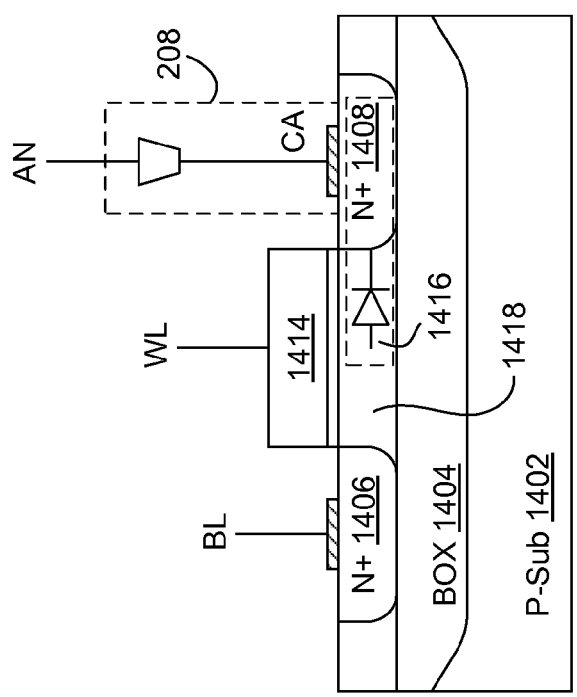
FIG. 14 is a cross-section diagram of an example resistive switching memory cell implementation in an SOI process, in accordance with embodiments of the present invention.

Referring now to FIG. 14, shown is a cross-section diagram of an example resistive switching memory cell implementation in a silicon on insulator (SOI) process, in accordance with embodiments of the present invention. In example 1400, buried oxide (BOX) 1404 can be disposed in P-substrate 1402, and PWELL 1418 can be disposed on BOX 1404. Diffusion region 1406 can include an N-type implant, and may form the drain of the access transistor, which can connect to the bit line. Diffusion region 1408 can also include an N-type implant, and may form the source of the access transistor, which can connect to the cathode of programmable impedance element 208. The anode of programmable impedance element 208 can be shared among other cells in a common anode architecture. Also, the word line can connect to gate 1414.

By taking advantage of SOI process characteristics, where separated PWELLs can be biased, a diode 1416 between the PWELL and implant N+ 1408 can be implemented. In particular embodiments, the PWELL being accessible allows for block erase at relatively low voltages via diode 1416, as compared to via the access transistor. Due to the relatively low erase voltage, there may be less variance in the cathode voltage during erase operations, and the cell may thus be less vulnerable to reverse program effects. Also, the endurance can be enhanced due to a reduced occurrence of reverse programming, which may result in higher erase resistance and tighter control.

In particular embodiments, the diode can be dedicated for a high current path (e.g., for erase operations), which can result in a smaller access transistor because the access transistor does not have to supply such high currents. A reduced size access transistor has many advantages, such as accommodating the porting of CBRAM technology into advanced semiconductor process nodes. Also, the PWELL being accessible can allow for control of the threshold voltage (Vtn) of the access transistor by changing the PWELL voltage level, which can enhance leakage protection. Thus, the PW connections can be controlled with well bias levels in order to reduce leakage via the access transistor.

Particular embodiments also support split voltage operation for a CBRAM array in a triple well process. Due to process variation or intentional process split, a forming voltage or a programming voltage of a CBRAM can be significantly higher than a voltage that is capable of being delivered to an anode terminal in some CBRAM array arrangements on a P-substrate. In addition, an erase voltage as applied to a bit line of a CBRAM array may be significantly high in order to achieve successful erasure of the resistive memory cell. Due to the relatively high body effect of the access transistor, it may be difficult to pass a desired high erase voltage from the bit line to the cathode of a CBRAM in a P-substrate, resulting in possible failure of the erase operation. In particular embodiments, a CBRAM can be included in a triple well instead of directly into a P-substrate. By controlling the triple well and associated biases, forming/programming and erasing operations can take advantage of a split voltage approach whereby the magnitude of the voltage as applied to the anode and/or bit line can be significantly reduced.

Figure 15:
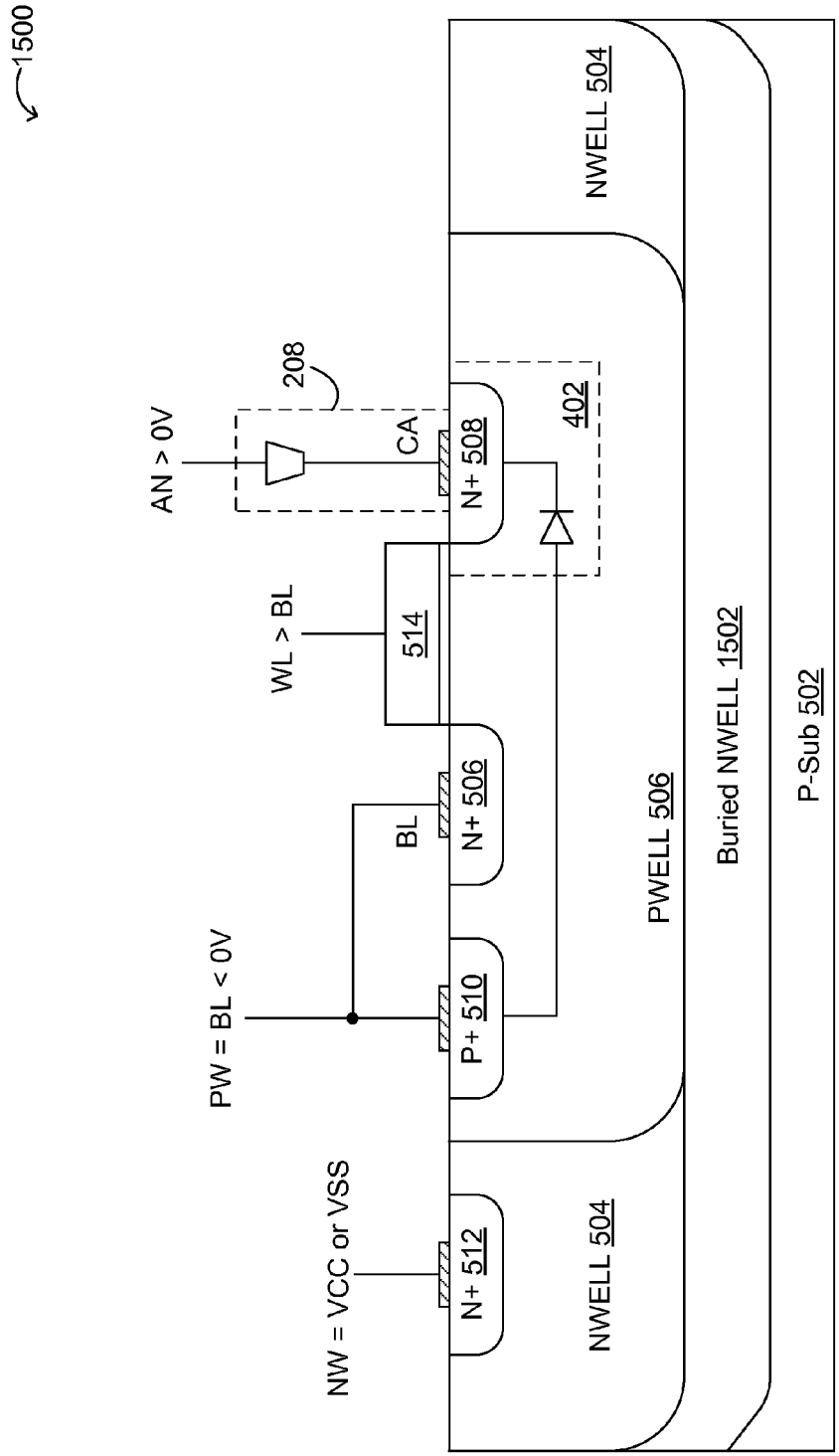
FIG. 15 is a cross-section diagram of an example resistive switching memory cell implementation in a triple well process and configured for a forming/programming operation, in accordance with embodiments of the present invention.

Referring now to FIG. 15, shown is a cross-section diagram of an example resistive switching memory cell implementation in a triple well process and configured for a forming/programming operation, in accordance with embodiments of the present invention. Example 1500 can be formed in a triple wells process, where PWELL 506 is accessible for implementation of diode 402 between PWELL 506 (at P+ 510) and implant N+ 508. Buried NWELL 1502 can be disposed in P-substrate 502, and NWELL 504 and PWELL 506 can be disposed above buried NWELL 1502. Diffusion region 506 can include an N-type implant, and may form the drain of the access transistor, which can connect to the bit line. Diffusion region 508 can also include an N-type implant, and may form the source of the access transistor, which can also connect to the cathode of programmable impedance element 208. Of course, the source and drain allocations can be reversed in the MOS access transistor.

In this example, the anode of programmable impedance element 208 can be shared among other cells in a common anode architecture. As discussed above, other architectures and/or circuit structures, such as a common cathode architecture, can also be supported in particular embodiments. Diffusion region 510 can include a P-type implant, and may form a well contact for PWELL 506. Also, diffusion region 512 can include an N-type implant, and may form a well contact for NWELL 504. In addition, the word line can connect to gate (e.g., polysilicon) 514. Also as discussed above, different structures as to well sharing and arrangement with respect to the word lines can also be supported in particular embodiments.

For a CBRAM array positioned directly in a P-substrate, forming and/or programming voltages may be applied to the anode while the bit line is grounded, and the word line is turned on for selected memory cells. In this type of arrangement, it may be very difficult to deliver an anode voltage beyond a magnitude comparable to a chip power supply voltage (e.g., VCC). For example, an anode may need about 4V applied thereto in order to carry out a forming or programming operation, while the chip power supply voltage may only be about 3.3V. In a triple well implementation, such a required 4V may be "split" between the anode and the bit line (e.g., AN=2V, BL/PW=−2V). As a result, the anode voltage may have more margin (e.g., 3.3V−2V=1.3V) in order to address other issues (e.g., material/process induced problems, cell uniformity problems, etc.) that may cut into this margin.

Figure 16:
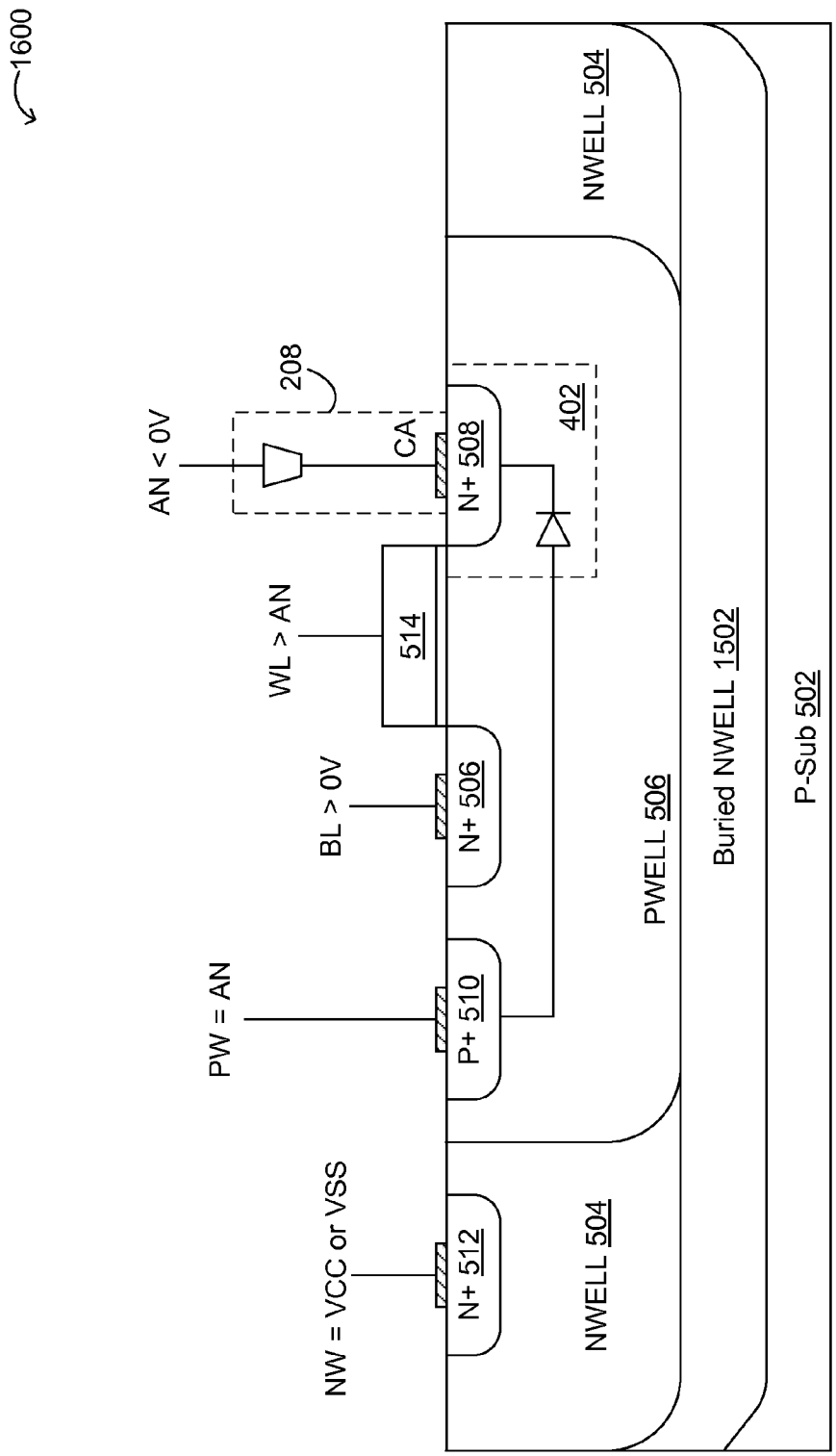
FIG. 16 is a cross-section diagram of an example resistive switching memory cell implementation in a triple well process and configured for an erase operation, in accordance with embodiments of the present invention.

Referring now to FIG. 16, shown is a cross-section diagram of an example resistive switching memory cell implementation in a triple well process and configured for an erase operation, in accordance with embodiments of the present invention. Due to the relatively high body effect (e.g., increased threshold voltage) of the access transistor, it may be difficult to pass a desired high erase voltage from the bit line to the cathode of a CBRAM in a P-substrate, resulting in possible failure of the erase operation. As shown in example 1600, a CBRAM can be included in a triple well instead of directly into a P-substrate. In this case, erase operations can take advantage of a split voltage approach whereby some of the bit line voltage can be shifted to the anode side. Such reduction of the bit line voltage magnitude can mitigate body effects, and allow for a lower word line voltage to be used in erase operations.

In this way, forming/programming and erase voltages can be split or otherwise allocated between anode and bit line terminals in a triple well implementation such that the absolute voltage value on the anode and the bit line of a resistive switching memory cell can be substantially reduced. In addition, both positive and negative voltages can be supported by decoder designs in order to supply the anode plate, the bit line driver, the word line driver, and the PW driver for passing of corresponding positive/negative voltages, as shown in the representative diagrams.

Resistive switching memory cells as discussed herein may also each support more than one memory state. In addition, depending on the voltage level controls, instead of a full erase or a full program/write, partial operations (e.g., by applying less/predetermined voltages for forward bias and reverse bias of the CBRAM cell, by applying different program current, etc.) can be performed. Such partial operations can produce different resistance and linear/nonlinear values in the cell, as opposed to the cell having an on/off resistance corresponding to two storage states. Instead, a binary coding of, e.g., eight different bands or ranges of CBRAM cell on resistances can be converted into 3-bit storage values. Thus in this example, eight different data values can be stored in a given CBRAM cell. Of course, other numbers of data values can be stored based on the resistance, linearity, bias voltage, and/or current characteristics.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A semiconductor memory device, comprising a plurality of resistive switching memory cells, wherein each resistive switching memory cell comprises:
    a) a programmable impedance element having an anode and a cathode;
    b) an access transistor having a drain coupled to a bit line, a source coupled to the programmable impedance element cathode, and a gate coupled to a word line;
    c) a well having a first diffusion region configured as the source, a second diffusion region configured as the drain, and a third diffusion region configured as a well contact; and
    d) a diode having a cathode at the first diffusion region, and an anode at the third diffusion region, wherein the diode is turned on during an erase operation on the programmable impedance element.

2. The semiconductor memory device of claim 1, wherein the diode is turned off during a program operation on the programmable impedance element.

3. The semiconductor memory device of claim 1, wherein the diode is turned off during a read operation on the programmable impedance element.

4. The semiconductor memory device of claim 1, wherein the word line is turned off during the erase operation on the programmable impedance element.

5. The semiconductor memory device of claim 1, wherein each programmable impedance element anode is connected together for the plurality of resistive switching memory cells.

6. The semiconductor memory device of claim 1, wherein:
    a) each of the first and second diffusion regions comprises an N+ region; and
    b) the third diffusion region comprises a P+ region.

7. The semiconductor memory device of claim 6, wherein the well comprises a P-type well.

8. The semiconductor memory device of claim 7, further comprising an N-type well, wherein the P-type well is disposed within the N-type well.

9. The semiconductor memory device of claim 1, wherein the well is disposed along a subset of the plurality of resistive switching memory cells having a common word line.

10. The semiconductor memory device of claim 1, wherein the plurality of resistive switching memory cells are formed in a triple well process.

11. The semiconductor memory device of claim 1, wherein the plurality of resistive switching memory cells are formed in a silicon on insulator (SOI) process.

12. The semiconductor memory device of claim 1, wherein the programmable impedance element comprises:
    a) an inert electrode coupled to a first side of a solid electrolyte;
    b) an active electrode coupled to a second side of the solid electrolyte, wherein the programmable impedance element is programmed by formation of a conductive path between the active and inert electrodes; and
    c) a plurality of mobile elements derived from the active electrode, wherein the plurality of mobile elements are reduced in the solid electrolyte to form the conductive path.

13. The semiconductor memory device of claim 12, wherein the conductive path in the programmable impedance element is formed by application of a first voltage across the active and inert electrodes, the conductive path remaining once formed after the first voltage is removed.

14. The semiconductor memory device of claim 12, wherein at least a portion of the conductive path is dissolved to erase the programmable impedance element by application of a second voltage across the active and inert electrodes.

15. A method of controlling a resistive switching memory cell, the method comprising:
    a) determining if a command to executed on the resistive switching memory cell is a read operation, a program operation, or an erase operation, wherein the resistive switching memory cell comprises: a programmable impedance element having an anode and a cathode; an access transistor having a drain coupled to a bit line, a source coupled to the programmable impedance element cathode, and a gate coupled to a word line; a well having a first diffusion region configured as the source, a second diffusion region configured as the drain, and a third diffusion region configured as a well contact; and a diode having an anode at the second diffusion region, and a cathode at the third diffusion region;
    b) turning on the word line for the program operation and the read operation;
    c) turning off the word line for the erase operation; and
    d) turning on the diode for the erase operation.

16. The method of claim 15, further comprising turning the diode off for the program operation and the read operation.

17. The method of claim 15, wherein the turning on the diode for the erase operation comprising applying a high level on the well contact.

18. The method of claim 15, wherein the erase operation comprises a block erase.

19. A semiconductor memory device, comprising a plurality of resistive switching memory cells, wherein each resistive switching memory cell comprises:
    a) a programmable impedance element having an anode and a cathode;
    b) an access transistor having a source coupled to a bit line, a drain coupled to the programmable impedance element anode, and a gate coupled to a word line;
    c) a well having a first diffusion region configured as the source, a second diffusion region configured as the drain, and a third diffusion region configured as a well contact; and
    d) a diode having an anode at the first diffusion region, and a cathode at the third diffusion region, wherein the diode is turned on during an erase operation on the programmable impedance element.

20. The semiconductor memory device of claim 19, wherein the word line is turned off during the erase operation on the programmable impedance element.

* * * * *